United States Patent [19]
Culver

[11] Patent Number: 5,200,365
[45] Date of Patent: Apr. 6, 1993

[54] SYSTEM FOR ACHIEVING DESIRED BONDLENGTH OF ADHESIVE BETWEEN A SEMICONDUCTOR CHIP PACKAGE AND A HEATSINK

[75] Inventor: Robbyn M. Culver, San Jose, Calif.

[73] Assignee: VLSI Technology, Inc., San Jose, Calif.

[21] Appl. No.: 765,597

[22] Filed: Sep. 26, 1991

Related U.S. Application Data

[62] Division of Ser. No. 523,443, May 14, 1990, Pat. No. 5,055,909.

[51] Int. Cl.⁵ .................. H01L 21/56; H01L 21/58
[52] U.S. Cl. ............................. 437/209; 437/902
[58] Field of Search ............. 437/902; 209; 439/485, 439/487; 357/81

[56] References Cited

U.S. PATENT DOCUMENTS 3,675,089  7/1972  Hantusch et al. ............. 437/902
4,899,210  2/1990  Lorenzetti et al. ............ 357/81

FOREIGN PATENT DOCUMENTS 5791528  6/1982  Japan ........................ 437/902

OTHER PUBLICATIONS

"Metal Wool and Indium Heat Sink"; B. J. Ronkese, IBM T.D.K. vol. 21 No. 3 pp. 1143, 1144, 8-78.

Primary Examiner—Olik Chaudhuri
Assistant Examiner—David E. Graybill
Attorney, Agent, or Firm—Majestic, Parsons, Siebert & Hsue

[57] ABSTRACT

Spacers are attached to or made an integral part of the housing of a semiconductor package in order to set a desired spacing between a surface of the package housing and the heatsink. Then when the heatsink is attached to the housing, a uniform clearance is maintained between the heatsink and the surface of the housing. When such clearance is filled with an epoxy for bonding the heatsink to the housing, the bondlength of the epoxy layer will be uniform and be of the desired value.

6 Claims, 3 Drawing Sheets

SYSTEM FOR ACHIEVING DESIRED BONDLENGTH OF ADHESIVE BETWEEN A SEMICONDUCTOR CHIP PACKAGE AND A HEATSINK

This is a divisional of application Ser. No. 523,443 filed May 14, 1990 now U.S. Pat. No. 5,055,909.

BACKGROUND OF THE INVENTION

This invention relates in general to semiconductor packaging and in particular to a system for achieving the desired bondlength of adhesives for bonding the housing of a semiconductor chip package to a heatsink.

For many semiconductor chip packages, particularly ceramic type packages, it is desirable to provide a heatsink for each package to facilitate the dissipation of heat generated by the chip. This is normally done by attaching a heatsink to the package using an adhesive such as an epoxy. In order for the epoxy to achieve the desired bonding strength to securely connect the heatsink to the package, it is usually desirable for the thickness of the epoxy layer between the heatsink and the package surface to be of a certain value depending on the type of epoxy used. Such thickness of the epoxy layer is also known as the bondlength of the epoxy. Therefore, when the heatsink is bonded to a surface of the semiconductor package, it is desirable to maintain a certain uniform clearance between the heatsink and the package, so that when the space between the package and the heatsink is filled by an epoxy layer, the bondlength of the epoxy layer is of a desired value. Such requirements for epoxy bonding are known to those skilled in the art.

A number of heatsink spacers have been proposed to set the spacing between the heatsink and the package so that the bondlength of the epoxy is of a desired value. Some of the conventional spaces used are discussed below in reference to figures. None of these prior art systems is entirely satisfactory. It is therefore desirable to provide an improved system for setting a spacing between the chip package housing and the heatsink so that the epoxy used has a predetermined bondlength.

SUMMARY OF THE INVENTION

This invention is directed towards a semiconductor package comprising a housing for holding a semiconductor chip and spacing means. The housing is suitable for connection to a heatsink to dissipate heat generated by the chip. The spacer means is attached to or integral with the housing for setting a spacing between the housing and the heatsink, so that when the heatsink is attached to the housing by an adhesive, the spacing is of a predetermined value. In this manner, sturdy adhesive bonding is achieved between the housing and the heatsink.

This invention is also directed to a method for attaching a heatsink to a semiconductor package. The package comprises a housing for holding a semiconductor chip. The housing has a surface suitable for connection to a heatsink to dissipate heat generated by the chip. The method comprises forming a plurality of spacers on the surface of the housing, applying an adhesive to the surface or to the heatsink and attaching the heatsink to the surface by the adhesive so that the bondlength of the adhesive between the heatsink and the spacers is of a predetermined value.

DETAILED DESCRIPTION OF THE INVENTION

Figure 1:
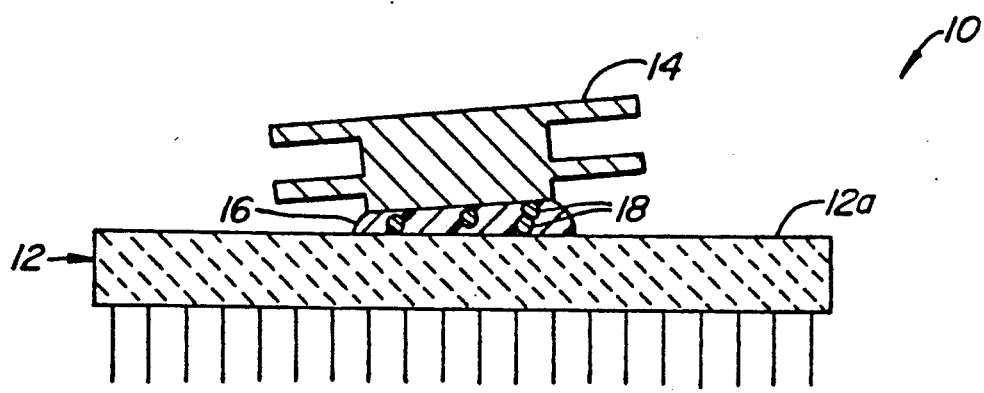
FIG. 1 is a cross-sectional view of a conventional ceramic pin grid array (CPGA) type package bonded to a heatsink by a conventional system.

FIG. 1 is a cross-sectional view of a CPGA-type package assembly 10 including a uni-directional 2-fin heatsink 14 attached to the package 12 by a conventional bonding method. As shown in FIG. package assembly 10 includes a CPGA-type package 12, heatsink 14, and epoxy 16 for attaching the heatsink to the CPGA package 12. As explained above, it is desirable to set the spacing between heatsink 14 and surface 12a of CPGA package 12 so that the bondlength of epoxy 16 is of the desired value. In the conventional bonding system illustrates in FIG. 1, this is accomplished by using microbeads 18 whose diameters are about the same as the desired bondlength. As shown in FIG. 1, however, beads 18 can agglomerate, making it difficult to achieve a uniform bondlength.

Figure 2:
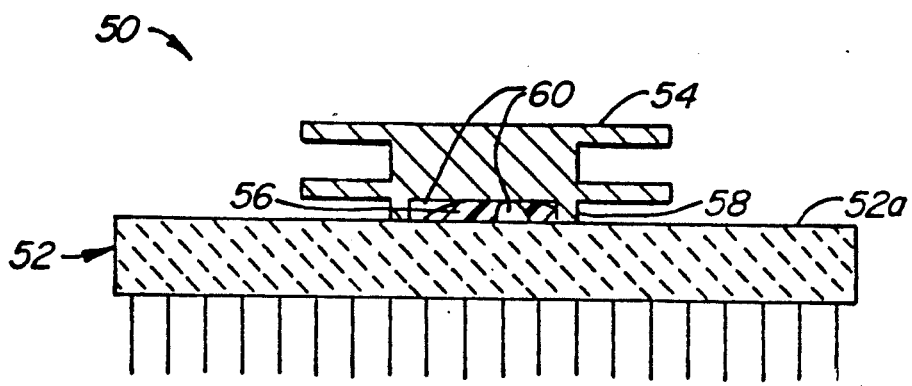
FIG. 2 is a cross-sectional view of a CPGA-type package bonded to a heatsink with a pedestal serving as a spacer to illustrate another conventional system for bonding.

The same components in the different figures for the purpose of this invention are identified by the same numerals. FIG. 2 is a cross-sectional view of a package 50 including a CPGA-type package 52, heatsink 54, epoxy 56, and a ring-shaped spacer 58 as an integral part of the heatsink. The epoxy 56 may be applied to surface 52a of the package or to the heatsink inside the ring-shaped spacer 58, before the heatsink 54 is attached to package 52.

Figure 3:
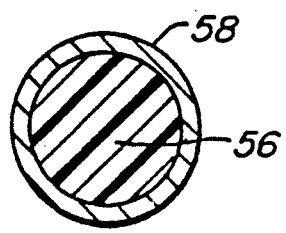
FIG. 3 is a bottom view of the spacer portion of the heatsink and epoxy of FIG. 2 to illustrate the conventional bonding system.

Irrespective of how the epoxy 56 is applied to attach the heatsink to the package, the use of a pedestal 58 as an integral part of the heatsink can cause voids or gaps 60 in the epoxy 56 which are undetectable at the time of assembling assembly 50. The voids or gaps 60 are undesirable and reduce the strength of bonding of the epoxy 56. FIG. 3 is a bottom view of ring 58 with epoxy 56 filling all the space in the spacer. In other words, in order for epoxy 56 to achieve the desired bondlength throughout the ring 58, the space inside ring 58 must be completely filled by means of epoxy.

The above-described conventional system for bonding heatsinks to semiconductor chip packages illustrated in FIGS. 2 and 3 are undesirable since they require that the spacer be attached to or be made an integral part of the heatsink. Standard heatsinks are relatively inexpensive when purchased in a standard or generic form. If the heatsink needs to be modified to include spacers such as spacer 58 in FIGS. 2 and 3, this would greatly increase the cost of the heatsink. For this reason and other reasons explained above, it is desirable to provide a system for bonding heatsinks to semiconductor chip packages in which the above-described disadvantages are avoided.

Figure 4:
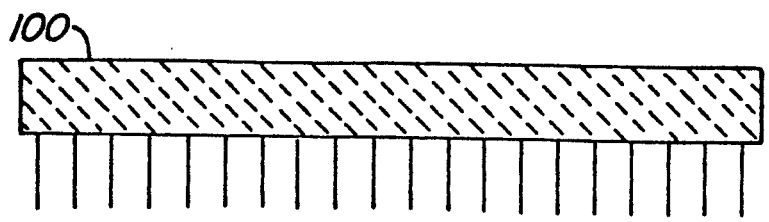
FIG. 4 is a cross-sectional view of a semiconductor package.
Figure 5:
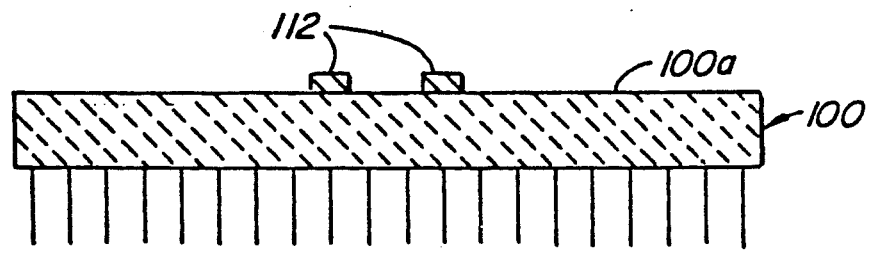
FIG. 5 is a cross-sectional view of the semiconductor chip package of FIG. 4 but with heatsink spacers attached to one of its surfaces.
Figure 6:
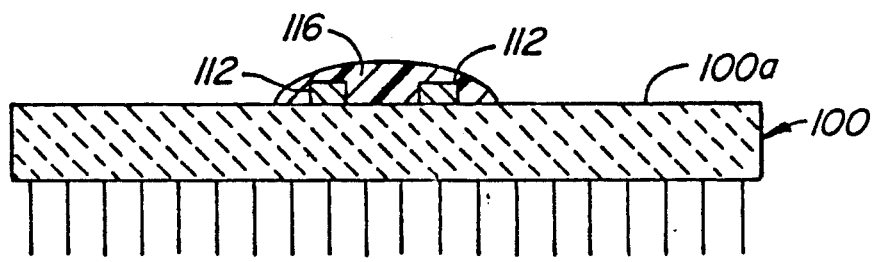
FIG. 6 is a cross-sectional view of the package of FIGS. 4 and 5, the heatsink spacers of FIG. 5 and, in addition, epoxy applied onto the package.
Figure 7:
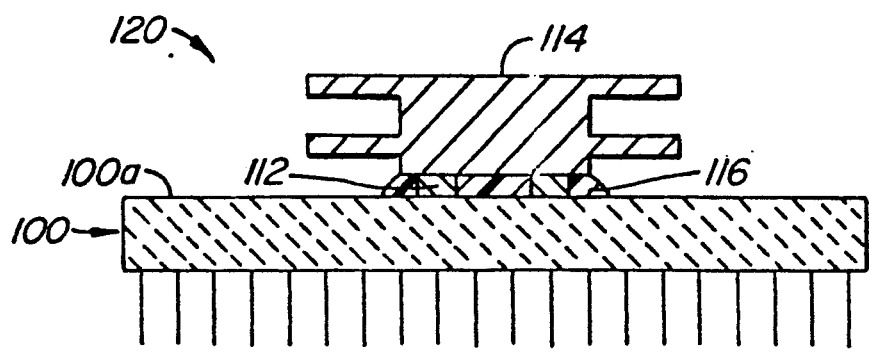
FIG. 7 is a cross-sectional view of a semiconductor chip package, heatsink spacers, epoxy and a heatsink attached to the package by means of epoxy and spaced apart from the package by the heatsink spacers.

This invention is based on the observation that, by attaching spacers or making these spacers an integral part of the housing of the semiconductor package, the above-described disadvantages can be avoided altogether. FIG. 4 is a cross-sectional view of a semiconductor package 100 to which heatsink spacers are to be attached. FIG. 5 is package 100 of FIG. 4 and, in addition, spacers 112 are attached to surface 100a of the package. FIG. 6 is a cross-sectional view of package 100 and spacers 112 of FIG. 5 and, in addition, epoxy 116 is applied on top of surface 100a and spacers 112. FIG. 7 is a cross-sectional view of the package, spacers and epoxy of FIG. 6 but with a heatsink 114 pressed against the spacers 112 so that epoxy 116 bonds the heatsink to package 100 to form the package assembly 120. When the heatsink 114 is pressed against the spacers 112, the spacers set the spacing between the heatsink and surface 100a to a desired value equal to the height of the spacers, so that the bondlength of the epoxy layer 116 is of the desired value. For commonly used types of epoxy, the desired bondlength may be in the range of 1 to 10 mils, such as 4 mils. FIGS. 4–7 illustrate the order of the above-described three steps that are performed in some embodiments of the invention to obtain the package assembly 120 in FIG. 7.

In the bonding system illustrated in FIGS. 4–7 described above, the heatsink 114 can be the relatively inexpensive standard or generic type. Unlike microbeads 18 of FIG. 1, spacers 112 are not mixed together with epoxy before both are applied to the package or heatsink and will therefore not agglomerate. Furthermore, by applying epoxy 116 to surface 100a and on top of spacers 112, it is possible to bond heatsink 114 to surface 100a and spacers 112 with no voids or gaps to weaken the epoxy bonds. This is true even when spacers 112 form a ring similar to ring 58 of FIG. 3. It is, of course, possible to apply the epoxy to the heatsink 114 instead of the surface 100a as shown in FIG. 6 and then press the heatsink against surface 100a; in such event, one should be careful not to leave gaps or voids in the epoxy.

Preferably, spacers 112 are made of a material with better thermal conductivity than epoxy or other kinds of suitable adhesives to enhance the thermal dissipation of the package. Such material may be a metal or an alloy, for example. Another advantage in the bonding system of FIGS. 4–7 is the ease in attaching the spacers 112 to package 100. Spacers 112 may be formed by screen printing by a conventional screen printing method. As is well-known to those in the screen printing art, the screen printing method can be used to form spacers 112 of any desired and specified height. Spacers 112 formed by screen printing may compose of any metal such as tungsten. Alternatively, spacers 112 may compose of a metallic material such as a copper-tungsten alloy attached to surface 100a by brazing where spacers 112 are of a specified height. As a third alternative, solder balls of a specified height may be attached to a surface 100a where the desired bonding could be achieved by first forming the solder balls on the package and then polishing the balls down to the desired height. In screen printing, soldering solder balls or brazing, it is necessary to first plate a portion of surface 100a so that the plated or coated surface will adhere well to solder balls or the heatsink spacers made of a metallic material, particularly if package 100 is made of a ceramic material. In such event, surface 100a may be coated with gold, copper or silver. The solder ball or metallic heatsink spacers are then placed on top of the coated surface where the solder ball (serving as a spacer) or the heatsink spacer to be brazed are attached to the coated surface by soldering or brazing.

Figure 8:
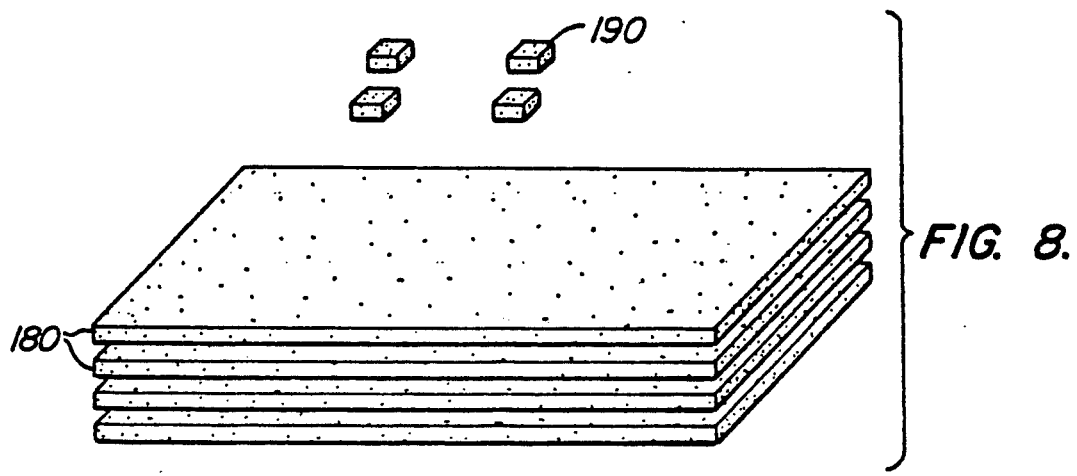
FIG. 8 is a perspective view of laminating ceramic green sheets for forming a semiconductor package, and laminating ceramic green sheets in the shape of spacers to be formed as an integral part of the package.
Figure 9:
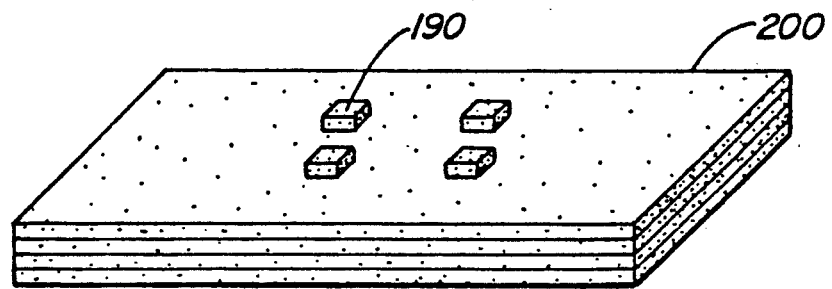
FIG. 9 is a perspective view of the laminating ceramic green sheets of FIG. 8 after they have been formed as an integral part of the semiconductor chip package.

FIGS. 8 and 9 illustrate another method for forming the spacers as an integral part of the package. FIG. 8 is a perspective view of laminating ceramic green sheets 180 for forming a semiconductor chip package as well as laminating ceramic green sheets 190 in the shape of spacers. FIG. 9 is a perspective view of the green sheets of FIG. 8 where green sheets 180 are stacked together to form a package 200 with spacers 190 forming an integral part of the package.

Four methods of forming the spacers as an attachment to or part of the package have been described to illustrate the invention. These methods are advantageous over conventional methods in that they can be performed simultaneously with other manufacturing processes in forming the package. Thus the plating of surface 100a may be performed with forming contacts on the package housing 100, as are the soldering process for attaching the solder balls to surface 100a. Pins plated with gold are often brazed onto CPGA-type packages. Thus the brazing process for attaching the metallic spacers to surface 100a may be performed together with the pin brazing process. The ceramic green sheet material for forming the spacers may be heated along with the green sheets for forming the chip.

The forming process using screen printing or brazing is particularly advantageous since they are the easiest to control for forming spacers of the required specified height. The forming of spacers 190 on package 200 using ceramic green sheets, on the other hand, is more difficult to control since the ceramic green sheet material shrinks more than metal.

At least some of the above-described embodiments are advantageous over the bonding system of FIG. 1 in that the bonding provides improved thermal dissipation. Thus where spacers 112 are made of metal (formed by screen printing, soldering or brazing), a good heat conducting path is provided by the spacer to improve thermal dissipation of the package through the heatsink.

The above-described screen printing, brazing, soldering and laminating green sheets are known to those skilled in the semiconductor packaging art. For a reference to such techniques, see *Microelectronics Packaging Handbook*. Tummala et al., pp. 464–469, 476–493, 744–745, 1132–1133, 1140–1143, 1148–1151, New York (1989).

While the invention has been described by reference to particular packages and heatsinks and specific bonding methods, it will be understood that various modifications may be made. Thus while the invention is particularly advantageous for use on ceramic-type packages, such as the CPGA, it will be understood that it may also be useful for other types of packages such as plastic packages. It will also be evident that the heatsink may be of any kind, shape or size. While the bonding material described above is epoxy, it will be understood that other adhesives may also be used where the strength of bonding is related to the bondlength. This invention may also be useful for bonding seal rings to a housing of a ceramic-type package where the seal ring is used for supporting a package lid. The scope of the invention is to be limited only by the appended claims.

What is claimed is:

1. A method for attaching a heatsink to a semiconductor package, said package comprising a housing for holding a semiconductor chip, said housing having a surface suitable for connection to a heatsink to dissipate heat generated by the chip, said method comprising:

forming a plurality of spacers on said surface of the housing;

applying an adhesive to the surface or the heatsink;

attaching the heatsink to the surface by said adhesive so that a bondlength of the adhesive between the heatsink and the surface is substantially defined by the thickness of the spacers.

2. The method of claim 1, wherein said forming step comprises screen printing a material onto the surface.

3. The method of claim 1, wherein said forming step comprises placing solder balls onto the surface.

4. The method of claim 3, wherein said forming step includes polishing the solder balls.

5. The method of claim 1, wherein said forming step comprises brazing bodies onto the surface.

6. The method of claim 1, wherein said housing is made by shaping a ceramic green sheet material into a container for containing the chip and heating said material, and wherein said forming step comprises forming bodies made of said ceramic green sheet material onto the surface and heating said bodies along with the container to form the housing and the spacers.

* * * * *